United States Patent [19]
Geosling

[11] Patent Number: 5,766,340
[45] Date of Patent: Jun. 16, 1998

[54] METHOD FOR POST-POLING MOBILE ION REDISTRIBUTION IN LITHIUM NIOBATE

[75] Inventor: Christine E. Geosling, Calabasas, Calif.

[73] Assignee: Litton Systems, Inc., Woodland Hills, Calif.

[21] Appl. No.: 828,333

[22] Filed: Mar. 28, 1997

[51] Int. Cl.⁶ .................................................. C30B 29/30
[52] U.S. Cl. ........................... 117/2; 117/3; 117/948
[58] Field of Search .................................. 117/2, 3, 948

[56] References Cited

U.S. PATENT DOCUMENTS

| | | | |
|---|---|---|---|
| 5,422,873 | 6/1995 | Kewitsch et al. | 369/103 |
| 5,477,807 | 12/1995 | Yamada et al. | 117/948 |
| 5,519,802 | 5/1996 | Field et al. | 385/129 |

FOREIGN PATENT DOCUMENTS

| | | |
|---|---|---|
| 240758 | 11/1986 | Germany. |
| 57-140400 | 8/1982 | Japan. |
| 60-141700 | 7/1985 | Japan. |
| 63-35497 | 2/1988 | Japan. |

Primary Examiner—Robert Kunemund
Attorney, Agent, or Firm—Lynn & Lynn

[57] ABSTRACT

A method for poling a ferroelectric crystal includes heating the crystal to a temperature above its Curie temperature and applying a first selected voltage to the electrodes to apply an electric field to the crystal. The temperature of the crystal is then reduced to a temperature below the Curie temperature of the crystal, and a second electric field having polarity opposite to the polarity of the first electric field is applied to the crystal. Application of the second electric field reduces nonuniformity in ion concentration across the crystal.

5 Claims, 1 Drawing Sheet

METHOD FOR POST-POLING MOBILE ION REDISTRIBUTION IN LITHIUM NIOBATE

BACKGROUND OF THE INVENTION

This invention relates generally to poling a crystal having ferroelectric domains that can be aligned by application of an electric field. This invention relates particularly to a technique for poling a LiNbO₃ crystal to obtain selected electrooptic properties for fabricating electrooptic devices such as waveguides, phase modulators, polarizers and other devices. Still more particularly, this invention relates to poling a LiNbO₃ crystal for forming a multifunction integrated optics circuit that may be used in a fiber optic rotation sensor.

Lithium niobate is a single crystal oxide material that has well-known technical applications. Lithium niobate is ferroelectric at room temperatures with a Curie transition typically about 100° C. below the melting point. Single crystals need to be "poled" or aligned to eliminate an undesirable multiplicity of ferroelectric domains.

Previous poling techniques include the step of applying an electric field to a LiNbO₃ crystal or boule to align the ferroelectric domains. The electric field is applied while the crystal is at a temperature that is above the Curie temperature of LiNbO₃. The crystal is then cooled through its Curie transition. The poling operation can be either a step of the process used to grow the crystal or a separate post-growth processing step.

As an undesirable side effect, this poling process also causes the lithium ions and any other mobile ions that are present in the LiNbO₃ crystal lattice to migrate along the path of the induced electric field. The resulting nonuniformity in ion concentration across the crystal can lead to nonuniform properties in cross section across a wafer in x- or y-cut wafers, for example, or from wafer to wafer along a boule (as in z-cut wafers) depending on the crystal growth and/or dice axis. These nonuniformities include differences in diffusion rates, particularly proton diffusion rates, and localized stress and strain. These properties are critical to the formation and performance of waveguide structures.

SUMMARY OF THE INVENTION

The present invention provides a method for poling a crystal which overcomes the difficulties of the prior art poling techniques. The method according to the present invention for poling a crystal having ferroelectric domains that may be that aligned to provide selected electroooptic properties comprises the steps of:

(a) heating the crystal to a temperature above its Curie temperature;

(b) placing the crystal between a pair of electrodes;

(c) applying a first selected voltage to the electrodes to apply a first electric field of a first selected magnitude and polarity to the crystal;

(d) reducing the temperature of the crystal to a temperature below the Curie temperature of the crystal; and (e) applying to the crystal a second electric field having polarity opposite to the polarity of the first electric field.

Application of the second electric field reduces nonuniformity in ion concentration across the crystal. The second electric field preferably has a magnitude that is equal to the magnitude of the first electric field. The magnitude of the second electric field may also be greater than or less than the magnitude of the first electric field.

An appreciation of the objectives of the present invention and a more complete understanding of its structure and method of operation may be had by studying the following description of the preferred embodiment and by referring to the accompanying drawings.

DESCRIPTION OF THE PREFERRED EMBODIMENT

Because preventing ion movement during poling is a difficult, if not impossible, task, the poling process according to the present invention includes a two-step approach to obtaining selected characteristics without undesirable ion migration. The first step of the poling process is to pole a LiNbO₃ crystal 10 in the usual manner at a temperature that is above the Curie temperature, $T_c$, in an optimum manner to obtain domain alignment. The Curie temperature for congruently grown LiNbO₃ is 1142° C.

Figure 1:
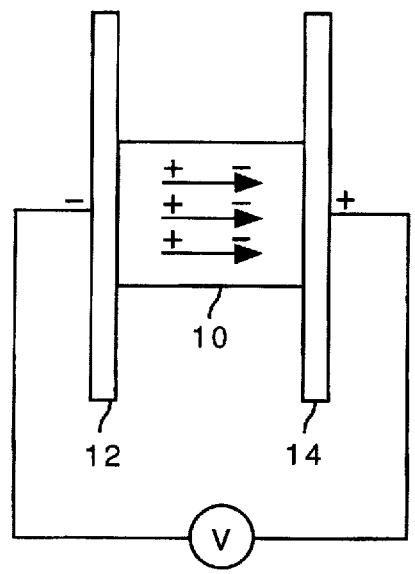
FIG. 1 illustrates a step of the process according to the present invention in which a LiNbO₃ crystal is poled by application of a potential difference to a pair of electrodes placed on opposite sides of the LiNbO₃ crystal.

Referring to FIG. 1 the LiNbO₃ crystal 10 is placed between and in contact with a pair of electrodes 12 and 14. A voltage is applied to the electrodes 12 and 14 so that the electrode 12 is positive relative to the electrode 14. In poling a typical LiNbO₃ crystal, the voltage across the electrodes is typically 0.5 V/cm along the polar axis.

Figure 2:
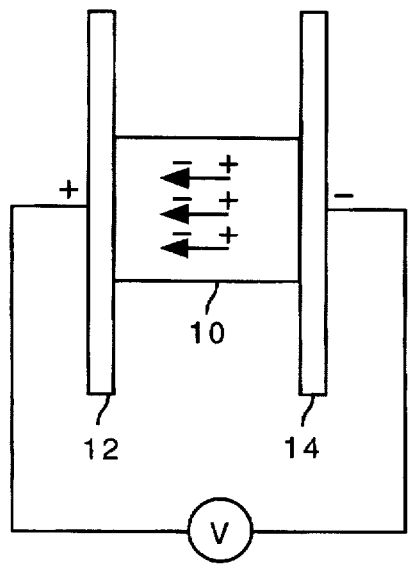
FIG. 2 illustrates another step of the process according to the present invention in which the polarity of the electrodes is reversed while the LiNbO₃ crystal is at a temperature that is below the Curie temperature.

A second step of the process is subsequently carried out below the Curie temperature but above approximately 800° C., which is in the temperature regime where lithium ions are mobile. At a temperature within this range, the crystal 10 is subjected to an electric field of the same magnitude but of opposite polarity as was employed for poling in the first step of the process. Application of the electric field of opposite polarity may be accomplished by reversing the polarity on the same electrodes as used for poling so that the electrode 14 is positive in FIG. 2.

Application of the reverse-polarity electric field causes the ions in the LiNbO₃ crystal to migrate back in the direction from which they came. However, because the LiNbO₃ crystal is below the Curie Temperature, the ferroelectric domain structure remains intact. Application of the reverse polarity electric field at a temperature below $T_c$ has the effect of reducing the gradient in mobile ion composition across the poling axis of the crystal.

The amount of ion movement depends upon the temperature and voltage during the second step of the process and the time duration of the process. Because the temperature of the back-migration process is lower than that of the original poling process, the time required for back migration will be longer than the time duration of the first step of the process at the same voltage. The drift velocity is proportional to $1/\rho$ (where $\rho$ is the resistivity of the LiNbO₃ crystal in units of $\Omega$-cm). The resistivity is a function of temperature.

With knowledge of at least one resistivity at a specific temperature and an activation energy, an Arrhenius plot can be generated. The resistivity/temperature relationship allows calculation of the correct back-migration time to compensate for the forward drift due to poling. The correct back-migration time is related to the poling time in the same proportion as are the resistivities at the respective temperatures.

If more than one mobile ion is present in the LiNbO$_3$ crystal, subsequent processes of this same sort can be carried out at even lower temperatures to modify the concentration gradients. The H$^{30}$ ion, for example, is mobile below about 800° C., whereas the Li$^{30}$ ion is not. Knowledge of specific resistivities and activation energies are needed to define the relative process times.

If a shorter back-migration time is desired, the magnitude of the reverse electric field can be increased by increasing the applied voltage. The time adjustment would, however, require the knowledge of the actual drift velocities as a function of the electric field, or it would be adjusted empirically. Care must also be taken not to compromise the domain structure of the poled LiNbO$_3$ crystal at higher voltages.

The structures and methods disclosed herein illustrate the principles of the present invention. The invention may be embodied in other specific forms without departing from its spirit or essential characteristics. The described embodiments are to be considered in all respects as exemplary and illustrative rather than restrictive. Therefore, the appended claims rather than the foregoing description define the scope of the invention. All modifications to the embodiments described herein that come within the meaning and range of equivalence of the claims are embraced within the scope of the invention.

What is claimed is:

1. A process for poling a crystal having ferroelectric domains that may be aligned to provide selected electrooooptic properties, comprising the steps of:
   (a) heating the crystal to a temperature above its Curie temperature;
   (b) placing the crystal between a pair of electrodes;
   (c) applying a first selected voltage to the electrodes to apply a first electric field of a first selected magnitude and polarity to the crystal;
   (d) reducing the temperature of the crystal to a temperature below the Curie temperature of the crystal; and
   (e) applying to the crystal a second electric field having polarity opposite to the polarity of the first electric field.

2. The method of claim 1 wherein the crystal is in contact with the pair of electrodes.

3. The process of claim 1 wherein the second electric field has a magnitude equal to the magnitude of the first electric field.

4. The process of claim 1 wherein the second electric field has a magnitude less than the magnitude of the first electric field.

5. The process of claim 1 wherein the second electric field has a magnitude greater than the magnitude of the first electric field.

\* \* \* \* \*